United States Patent
Yoneda et al.

(10) Patent No.: US 6,581,258 B2
(45) Date of Patent: Jun. 24, 2003

(54) METHOD OF FORMING ELECTRODE FILM

(75) Inventors: Masayuki Yoneda, Shiga-ken (JP);
Yoshihiro Koshido, Kanazawa (JP);
Makoto Tose, Moriyama (JP);
Masatoshi Nakagawa, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 77 days.

(21) Appl. No.: 09/851,063

(22) Filed: May 8, 2001

(65) Prior Publication Data

US 2001/0042290 A1 Nov. 22, 2001

(30) Foreign Application Priority Data

May 19, 2000 (JP) ........................................ 2000-148853

(51) Int. Cl.⁷ ............................................... H04R 17/00
(52) U.S. Cl. ...................... 29/25.35; 29/847; 427/126.1
(58) Field of Search ................................ 29/25.35, 840, 29/846, 847, 860; 310/311, 313 R; 216/41; 427/100, 126.1, 126.2, 523; 430/313, 314

(56) References Cited

U.S. PATENT DOCUMENTS 6,057,628 A * 5/2000 Viljoen et al. ............... 310/311
6,441,489 B1 * 8/2002 Motoyama .................. 257/741

* cited by examiner

*Primary Examiner*—Gregory L. Huson
*Assistant Examiner*—Peter deVore
(74) *Attorney, Agent, or Firm*—Keating & Bennett, LLP

(57) ABSTRACT

A method of forming an electrode film using a vacuum deposition apparatus, includes the steps of depositing a refractory metal on a substrate after reaching a back pressure in a deposition chamber at a pressure that is within a range of about $1\times10^{-4}$ Pa to about $5'10^{-3}$ Pa, and annealing the substrate on which the metal is deposited to decrease the electrical resistivity of the electrode film.

13 Claims, 3 Drawing Sheets

METHOD OF FORMING ELECTRODE FILM

BACKGROUND OF THE INVENTION

1. Field of the Invention

The present invention relates to a method of forming an electrode film, and more particularly, to a method for decreasing the electrical resistivity of an electrode film for use with a resonator, a filter, or other electronic component.

2. Description of the Related Art

In a radio frequency resonator (surface acoustic wave device), a band-pass filter or other filter using a Love wave or shear horizontal ("SH") wave, a refractory metal is used to form an electrode film. The electrode film used for such application is required to have a low electrical resistivity, a high electromechanical coupling coefficient, and a high density. This is because the electrode film made of a refractory metal material is advantageous for suppressing deterioration in an insertion loss when increasing the frequency of a device, as compared with other materials.

It is known that when depositing such an electrode film made of a refractory metal on a piezoelectric substrate, the electrical resistivity of the electrode film rapidly increases depending upon pressure when deposition of the refractory metal is started at a back pressure of about $1 \times 10^{-4}$ Pa in a deposition chamber. For example, FIG. 4 shows the relationship between the back pressure (pressure in a vacuum chamber in which deposition is started) and the resistivity of an electrode film in depositing the electrode film made of a refractory metal such as tungsten. In this example, the resistivity is 13.4 $\mu\Omega \cdot$cm at a back pressure of $1.10 \times 10^{-5}$ Pa, 16.4 $\mu\Omega \cdot$cm at a back pressure of $1.40 \times 10^{-4}$ Pa, and 32.5 $\mu\Omega \cdot$cm at a back pressure of $4.00 \times 10^{-4}$ Pa. It can be confirmed that the electric conductivity of the electrode film deposited under a pressure of $1 \times 10^{-4}$ Pa or more is higher than the electrical resistivity of the electrode film deposited under a pressure of about $1 \times 10^{-5}$ Pa or lower.

Therefore, deposition of an electrode film made of a refractory metal is conventionally started after the deposition chamber is evacuated to $3 \times 10^{-5}$ Pa or lower.

A load lock system vacuum deposition apparatus is suitable for depositing an electrode film using a refractory metal under a high vacuum of $3 \times 10^{-5}$ Pa or less, as described above. However, such a load lock system deposition apparatus has the disadvantage that the apparatus is expensive, and the number of-the substrates that can be input per batch is small, thus increasing the deposition cost.

On the other hand, a batch system vacuum deposition apparatus is inexpensive and is capable of processing a large number of substrates per batch. However, such a batch system vacuum deposition apparatus requires being exposed to air each time a substrate is exchanged for a new substrate, and the time required for increasing the degree of vacuum increases as the degree of vacuum increases, thereby causing the problem of lengthening the exhaust time for deposition under $3 \times 10^{-5}$ Pa or less so as to greatly decrease the throughput and manufacturing efficiency.

SUMMARY OF THE INVENTION

In order to overcome the problems described above, preferred embodiments of the present invention provide a method of forming an electrode film to produce an electrode film having low electrical resistivity even when a refractory metal is deposited under a back pressure of about $1 \times 10^{-4}$ Pa or more.

According to one preferred embodiment of the present invention, a method of forming an electrode film includes starting deposition of a refractory metal such as tungsten, tantalum, or other suitable material on a substrate under a back pressure of about $1 \times 10^{-4}$ Pa to $5 \times 10^{-3}$ Pa, and then annealing the substrate on which the metal is deposited to decrease the electrical resistivity of the electrode film.

It is conventionally thought that when deposition of a refractory metal is started under a pressure of about $1 \times 10^{-4}$ Pa or more, the electrical resistivity of the electrode film is increased to be beyond the allowable range.

As a result of intensive research of the cause for the increase in the electrical resistivity, the inventors of the present invention discovered that in the electrode film deposited under a pressure of about $1 \times 10^{-4}$ Pa or more, the increase in the electrical resistivity is caused by hydrogen and an oxide contained in the electrode film. It was also discovered that the hydrogen and oxide contained in the electrode film can be removed as water and hydrogen gas from the electrode film by annealing under vacuum, thereby decreasing the electrical resistivity of the electrode film.

Therefore, in accordance with preferred embodiments of the present invention, even when deposition is started under a pressure of about $1 \times 10^{-4}$ Pa or more, the resistivity can be decreased by annealing under vacuum, thereby decreasing an insertion loss and the deposition cost of the electrode film.

According to preferred embodiments of the present invention, after deposition is started at a back pressure of about $1 \times 10^{-4}$ Pa to $5 \times 10^{-3}$ Pa, vacuum annealing is performed to decrease resistivity, thereby decreasing the insertion loss of a resonator, a band-pass filter, or other component, and improving the efficiency of production thereof to decrease the deposition cost of an electrode film.

Other features, steps, characteristics and advantages of the present invention will become apparent from the following detailed description of preferred embodiments of the present invention with reference to the attached drawings.

For the purpose of illustrating the present invention, there is shown in the drawings several forms that are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1A:
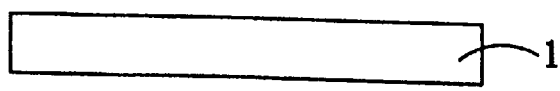
FIGS. 1A to 1H are drawings illustrating a method of forming an electrode film in accordance with a preferred embodiment of the present invention.

As shown in FIG. 1A, a piezoelectric substrate 1 is first prepared. As the piezoelectric substrate 1, a commercial $LiTaO_3$, $LiNbO_3$, $LiBi_4O_7$, quartz crystal, or piezoelectric ceramic material can be used. Other substrates can also be used. The surface of the piezoelectric substrate 1 is cleaned by wet cleaning with a neutral detergent, an alcohol, or the like, or dry cleaning with oxygen plasma, or other suitable cleaning agent.

Figure 1B:

As shown in FIG. 1B, a tungsten thin film 2 is then deposited over the entire surface of the piezoelectric substrate 1 preferably by using a batch system vacuum deposition apparatus or other suitable device. Although the vacuum deposition apparatus is generally used for deposition, a vacuum evaporation apparatus, a sputtering apparatus, or a CVD apparatus may be used, and the type of the apparatus used does not matter.

In this deposition step, after the piezoelectric substrate 1 is set in the vacuum chamber, the vacuum chamber is evacuated, deposition of the tungsten thin film 2 is started after the pressure in the vacuum chamber reaches the intended back pressure value, and Ar gas is introduced into the vacuum chamber so that deposition of the tungsten thin film 2 is performed under a pressure of about 0.4 Pa. However, deposition of the tungsten thin film 2 is preferably started under a back pressure of about $1 \times 10^{-4}$ Pa to about $5 \times 10^{-3}$ Pa.

Figure 1C:
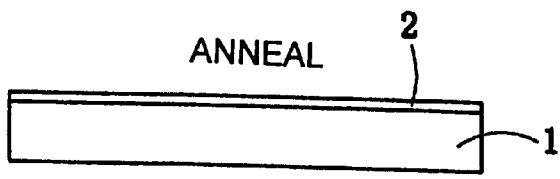

After the tungsten thin film 2 is formed on the surface of the piezoelectric substrate 1, as described above, the piezoelectric substrate 1 is annealed under a vacuum of about $5 \times 10^{-3}$ Pa or less, as shown in FIG. 1C.

Figure 2:
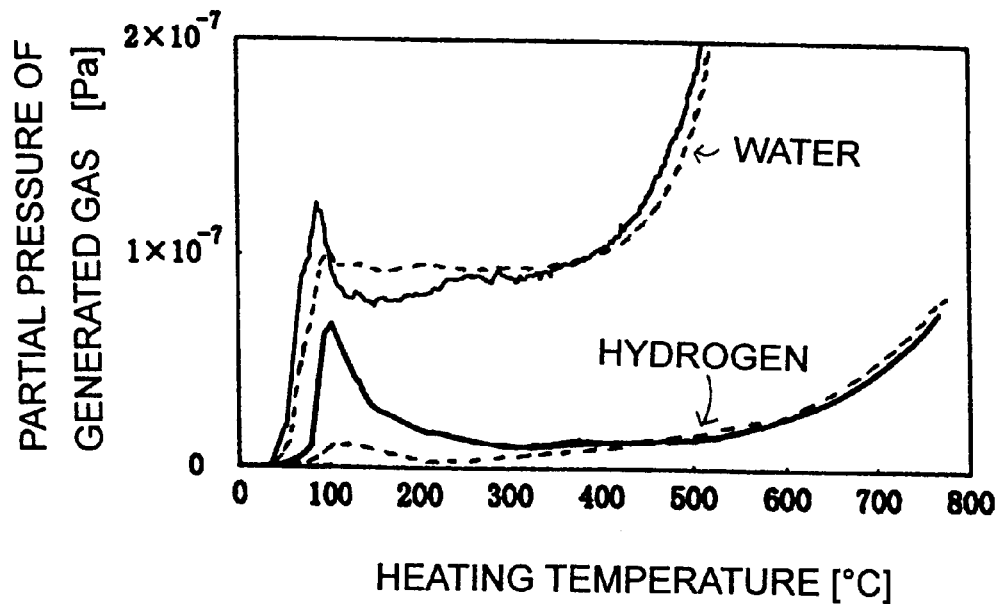
FIG. 2 is a graph showing the relationship between the vacuum annealing temperature (heating temperature) of a tungsten thin film and the partial pressures of the hydrogen gas and water generated from the tungsten thin films, which are deposited at about $4 \times 10^{-4}$ Pa and about $1 \times 10^{-5}$ Pa, respectively.

FIG. 2 shows the results of measurement of the partial pressures of the hydrogen gas and water generated from the tungsten thin film 2 when the vacuum annealing temperature (heating temperature) was changed to near about 800° C. In FIG. 2, solid lines indicate the tungsten thin film deposited at a back pressure of about $4 \times 10^{-4}$ Pa. Dotted lines in FIG. 2 indicate the results of the tungsten thin film deposited at a back pressure of about $1 \times 10^{-5}$ Pa. FIG. 2 shows that generation of hydrogen and water from the tungsten thin film 2 deposited at a back pressure of about $4 \times 10^{-4}$ Pa occurs at a temperature of about approximately 70° C. to approximately 150° C. On the other hand, the tungsten thin film deposited at a back pressure of about $1 \times 10^{-5}$ Pa generates neither hydrogen nor water, substantially. It is to be noted that the partial pressure of the water is relatively great at the temperature more than about 100° C. due to vaporization of water from the chamber of the measuring instrument.

As is understood from FIG. 2, it is preferable that the tungsten thin film is annealed at a temperature of about 150° C. or more so as to degas the tungsten thin film. It has been confirmed by the inventors that the vacuum annealing time is preferably about 30 minutes or more.

Figure 3A:
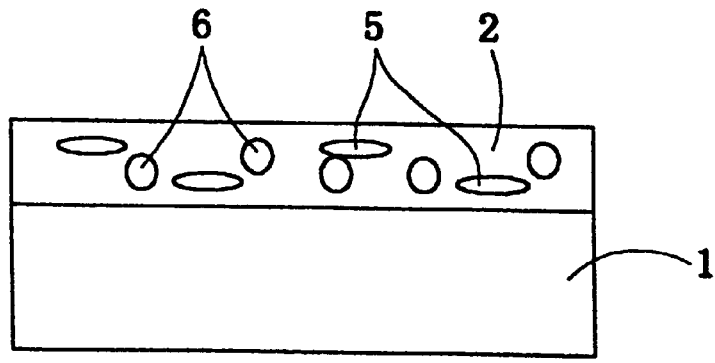
FIG. 3A is a sectional view schematically showing the state of a tungsten thin film before vacuum annealing.
Figure 3B:
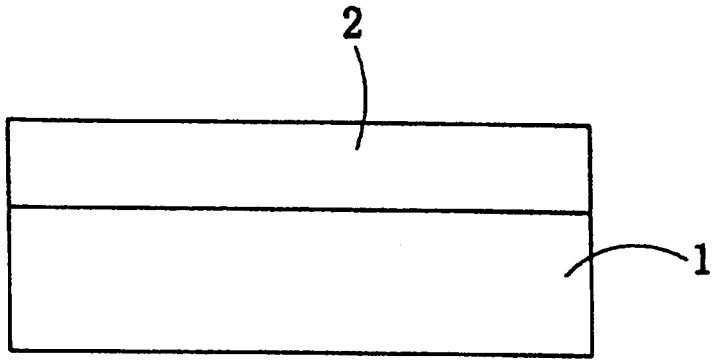
FIG. 3B is a sectional view schematically showing the state of the tungsten thin film after vacuum annealing.
Figure 4:
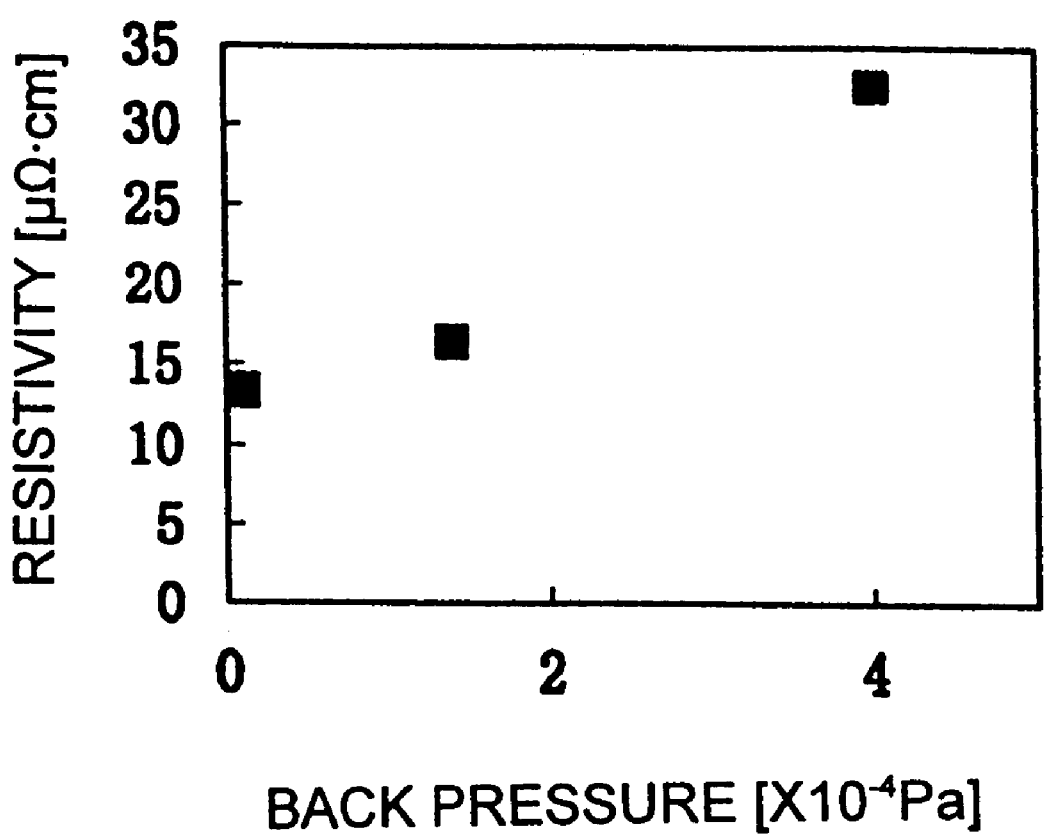
FIG. 4 is a graph showing the pressure (back pressure) in a vacuum chamber at the start of deposition and the resistivity of an electrode film.

After deposition of the tungsten thin film 2 and before vacuum annealing, as schematically shown in FIG. 3A, an oxide 5 and hydrogen 6 were detected in the tungsten thin film 2. The oxide 5 and hydrogen 6 are possibly caused by the fact that the resistance of the tungsten thin film 2 is increased. Therefore, as shown in FIG. 3B, the above-described vacuum annealing can escape the oxide 5 and hydrogen 6 as water and hydrogen in the tungsten thin film 2, thereby decreasing the electrical resistivity of the tungsten thin film 2.

Figure 1D:
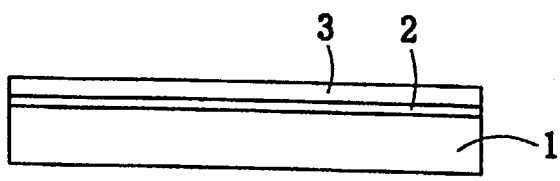
Figure 1E:
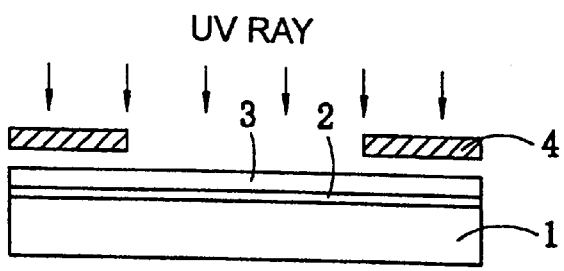
Figure 1F:
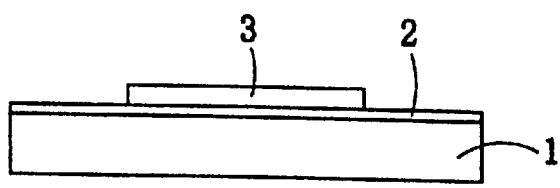
Figure 1G:
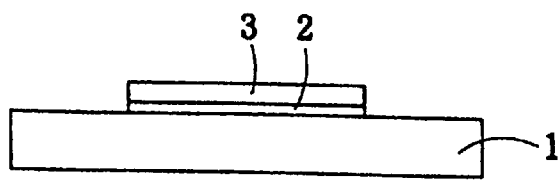
Figure 1H:
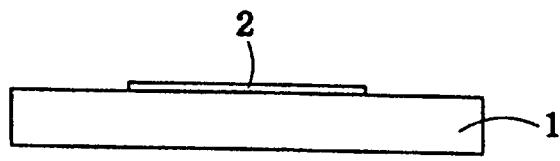

After the tungsten thin film 2 on the surface of the piezoelectric substrate 1 is annealed under vacuum, as shown in FIG. 1D, a resist film 3 is formed over the entire surface of the tungsten thin film 2. As the resist, either of a commercial negative type and positive type can be used. As shown in FIG. 1E, the resist film 3 is exposed by using a patterning mask 4 and an exposure device, developed by a development device, and then dried to form the resist film 3 having a desired pattern and cured on the tungsten thin film 2, as shown in FIG. 1F. The exposed portion of the tungsten thin film 2 is etched off with an etchant which can selectively etch the tungsten thin film 2, as shown in FIG. 1G, and then the resist film 3 is separated to form an electrode film (tungsten thin film 2) having a desired pattern, as shown in FIG. 1H. Etching may be performed by dry etching with plasma without using the etchant.

Then, the transmission characteristics of an element portion for a resonator, a filter, or other component are confirmed to examine whether or not the desired frequency characteristics are obtained. If the desired frequency characteristics are obtained, the process is transferred to the assembly step.

In this way, the tungsten thin film 2 is annealed under a vacuum of about $5 \times 10^{-3}$ Pa or less to remove the hydrogen and/or oxide $W_3O$ contained in the tungsten thin film 2 immediately after deposition, whereby the electrical resistivity can be decreased to the same level as a film deposited under a pressure of about $3 \times 10^{-5}$ Pa. Therefore, an electrode film having low electrical resistivity can be formed by vacuum annealing even when the film is deposited under relatively high pressure by using a batch system vacuum deposition apparatus or other suitable device, and an electrode film with a low insertion loss can be obtained at low cost.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of forming an electrode film using a vacuum deposition apparatus, the method comprising the steps of:

depositing a refractory metal on a substrate after reaching a back pressure in a deposition chamber at a pressure in a range of about $1 \times 10^{-4}$ Pa to about $5 \times 10^{-3}$ Pa; and annealing under vacuum the substrate on which the metal is deposited to decrease the electrical resistivity of the electrode film.

2. A method according to claim 1, wherein in the annealing step, the substrate is kept at a temperature of about 100° C. or more for approximately 30 minutes or more.

3. A method according to claim 2, wherein the refractory metal is one of tungsten and tantalum.

4. A method according to claim 1, wherein the substrate is a piezoelectric substrate.

5. A method according to claim 4, wherein the piezoelectric substrate is made of one of $LiTaO_3$, $LiNbO_3$, $LiBi_4O_7$, quartz crystal, and piezoelectric ceramic material.

6. A method according to claim 1, wherein the refractory metal deposited over the entire surface of the substrate using one of a batch system vacuum deposition apparatus, a vacuum evaporation apparatus, a sputtering apparatus, and a CVD apparatus.

7. A method according to claim 1, further comprising the step of introducing Ar gas into the vacuum chamber so that deposition of the refractory metal is performed under a pressure of about 0.4 Pa.

8. A method according to claim 1, wherein the step of annealing the substrate on which the metal is deposited is performed at a pressure of about $5\times10^{-3}$ Pa or less.

9. A method according to claim 1, wherein the step of annealing the refractory metal is performed at a temperature of about 150° C. or more.

10. A method according to claim 1, further comprising the step of forming a resist film over the entire surface of the refractory metal after the annealing step.

11. A method according to claim 10, wherein the resist film is one of a negative type and a positive type.

12. A method according to claim 10, further comprising the step of exposing the resist film using a patterning mask and an exposure device, developing the resist film and drying the resist film to produce a desired pattern.

13. The method according to claim 12, further comprising the step of etching exposed portions of the refractory metal to form an electrode film having a desired pattern.

* * * * *